(12) United States Patent
Cheng et al.

(10) Patent No.: US 12,245,400 B2
(45) Date of Patent: Mar. 4, 2025

(54) TANK WITH STABLE SUPPORT FOR LID WHEN LIFTED AND IMMERSION COOLING SYSTEM

(71) Applicant: Fulian Precision Electronics (Tianjin) Co., LTD., Tianjin (CN)

(72) Inventors: Yen-Lu Cheng, New Taipei (TW); Hao-Wen Cheng, Neihu (TW)

(73) Assignee: Fulian Precision Electronics (Tianjin) Co., LTD., Tianjin (CN)

(*) Notice: Subject to any disclaimer, the term of this patent is extended or adjusted under 35 U.S.C. 154(b) by 428 days.

(21) Appl. No.: 17/946,288

(22) Filed: Sep. 16, 2022

(65) Prior Publication Data

US 2023/0087146 A1 Mar. 23, 2023

(30) Foreign Application Priority Data

Sep. 18, 2021 (CN) .......................... 202122301092.5

(51) Int. Cl.
*H05K 7/20* (2006.01)
*B65D 90/62* (2006.01)

(52) U.S. Cl.
CPC ....... *H05K 7/20272* (2013.01); *B65D 90/623* (2013.01); *H05K 7/20236* (2013.01); *H05K 7/20781* (2013.01)

(58) Field of Classification Search
CPC .......... H05K 7/20272; H05K 7/20236; H05K 7/20781; B65D 90/623
See application file for complete search history.

(56) References Cited

U.S. PATENT DOCUMENTS

| | | | | |
|---|---|---|---|---|
| 5,335,451 | A * | 8/1994 | Druzynski | E05F 1/1075 49/386 |
| 8,453,948 | B2 * | 6/2013 | Altaii | B05B 15/622 248/419 |
| 10,082,281 | B1 * | 9/2018 | Liao | F21S 6/005 |
| 10,791,647 | B1 * | 9/2020 | Miyamura | H05K 7/1487 |
| 10,820,447 | B1 * | 10/2020 | Miyamura | H05K 7/20236 |
| 11,280,125 | B1 * | 3/2022 | Christie | B65F 1/1623 |
| 2003/0147224 | A1 * | 8/2003 | Chen | G06F 1/181 361/752 |
| 2005/0279750 | A1 * | 12/2005 | Barquist | F16M 11/18 220/629 |
| 2009/0284963 | A1 * | 11/2009 | Intravatola | F16M 11/28 248/157 |
| 2015/0152998 | A1 * | 6/2015 | Intravatola | F21V 21/22 248/528 |
| 2019/0053514 | A1 * | 2/2019 | Fonte | A23G 9/12 |
| 2019/0142161 | A1 * | 5/2019 | Mori | F16F 15/023 248/500 |
| 2020/0337176 | A1 * | 10/2020 | Aoki | H05K 7/20327 |
| 2021/0378148 | A1 * | 12/2021 | Chen | H05K 7/20272 |

* cited by examiner

*Primary Examiner* — Abhishek M Rathod
(74) *Attorney, Agent, or Firm* — ScienBiziP, P.C.

(57) ABSTRACT

A lid for a tank which is stably supported at various angles when open includes a tank or box, the lid, and at least one supporting component. The interior of the box contains components which are immersed in coolant for example, the lid allowing access thereto. The lid is rotatably connected to the box and covers or exposes the interior. The one or more supporting components are connected to the lid and the box. The lengths of the supporting components which stably support the lid at certain angles can be changed, which makes it convenient and risk-free for an operator to access the interior under the open lid. An immersion cooling system is also disclosed.

18 Claims, 7 Drawing Sheets

TANK WITH STABLE SUPPORT FOR LID WHEN LIFTED AND IMMERSION COOLING SYSTEM

FIELD

The subject matter herein generally relates to lid opening mechanism, and to tank and immersion cooling system.

BACKGROUND

The Immersion Cooling System is often used in a server room. Normally, the tank for immersion cooling is embedded in a rack. The depth of the tank often far exceeds the arm length of a person, which prevents operator from fully opening the tank's lid. This also results in the lid not being able to be opened stably, risking injury to the operator.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
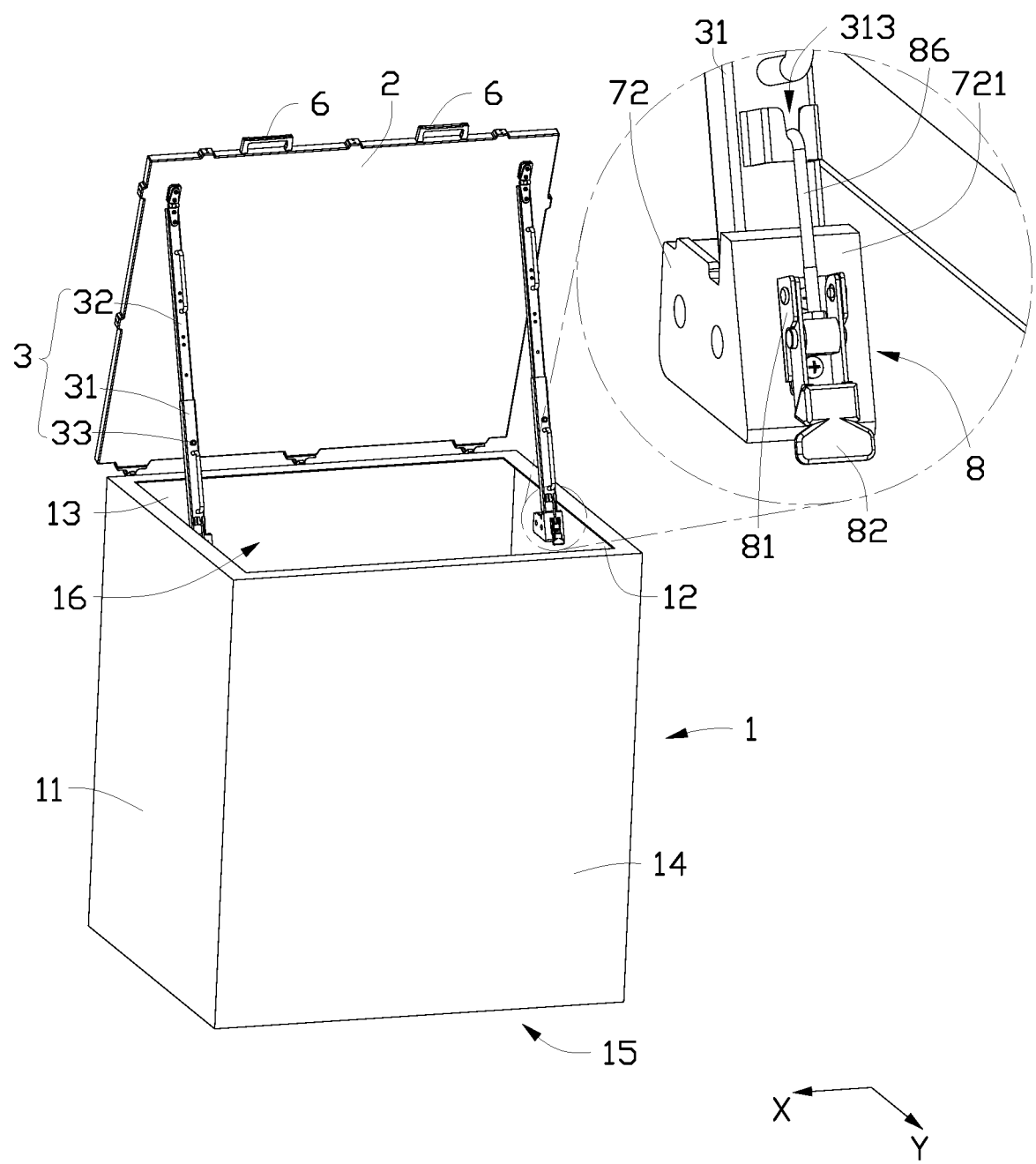
FIG. 1 is an isometric view of a tank according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The present disclosure, including the accompanying drawings, is illustrated by way of examples and not by way of limitation. Several definitions that apply throughout this disclosure will now be presented. It should be noted that references to "an" or "one" embodiment in this disclosure are not necessarily to the same embodiment, and such references mean "at least one".

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series, and the like.

Without a given definition otherwise, all terms used have the same meaning as commonly understood by those skilled in the art. The terms used herein in the description of the present disclosure are for the purpose of describing specific embodiments only, and are not intended to limit the present disclosure.

As shown in FIG. 1, a tank 100 of an embodiment includes a box 1, a lid 2, and at least one supporting component 3. When the lid 2 is lifted, opening 16 of the box 1 is exposed. The lid 2 is rotatably connected to the box 1. The lid 2 is used to open up or cover the opening 16. The supporting component 3 is connected to the lid 2 and the box 1. The supporting component 3 is variable in length to stably support the lid 2 at certain angles, which makes access to the interior convenient for operator.

In some embodiments, as shown in FIG. 1, the box 1 includes a first wall 11, a second wall 12, a third wall 13, a fourth wall 14, and a bottom wall 15. The first wall 11, the second wall 12, the third wall 13, and the fourth wall 14 are connected end to end. The first wall 11 is parallel to the second wall 12 along a direction Y. The third wall 13 is parallel to the fourth wall 14 along a direction X. The direction X is substantially perpendicular to the direction Y. The bottom wall 15 is connected to the bottom of the first wall 11, the second wall 12, the third wall 13, and the fourth wall 14. The opening 16 is formed at the tops of the first wall 11, the second wall 12, the third wall 13, and the fourth wall 14. The lid 2 can hinge on any one of the first wall 11, the second wall 12, the third wall 13, and the fourth wall 14. As shown in FIG. 1 for example, the lid 2 is hinged on the third wall 13.

In some embodiments, as shown in FIG. 1, there are two supporting components 3, each located on the first wall 11 and the second wall 12 for balance in support. The first wall 11 and the second wall 12 each have a hold 72. The end of the supporting component 3 away from the lid 2 is removably inserted into the hold 72. The hold 72 is used to locate the supporting component 3 on the first wall 11 and the second wall 12. In some other embodiments, there are one or several supporting components 3 located on the lid 2, each attached to a hold 72 mounted on the box 1.

Figure 2:
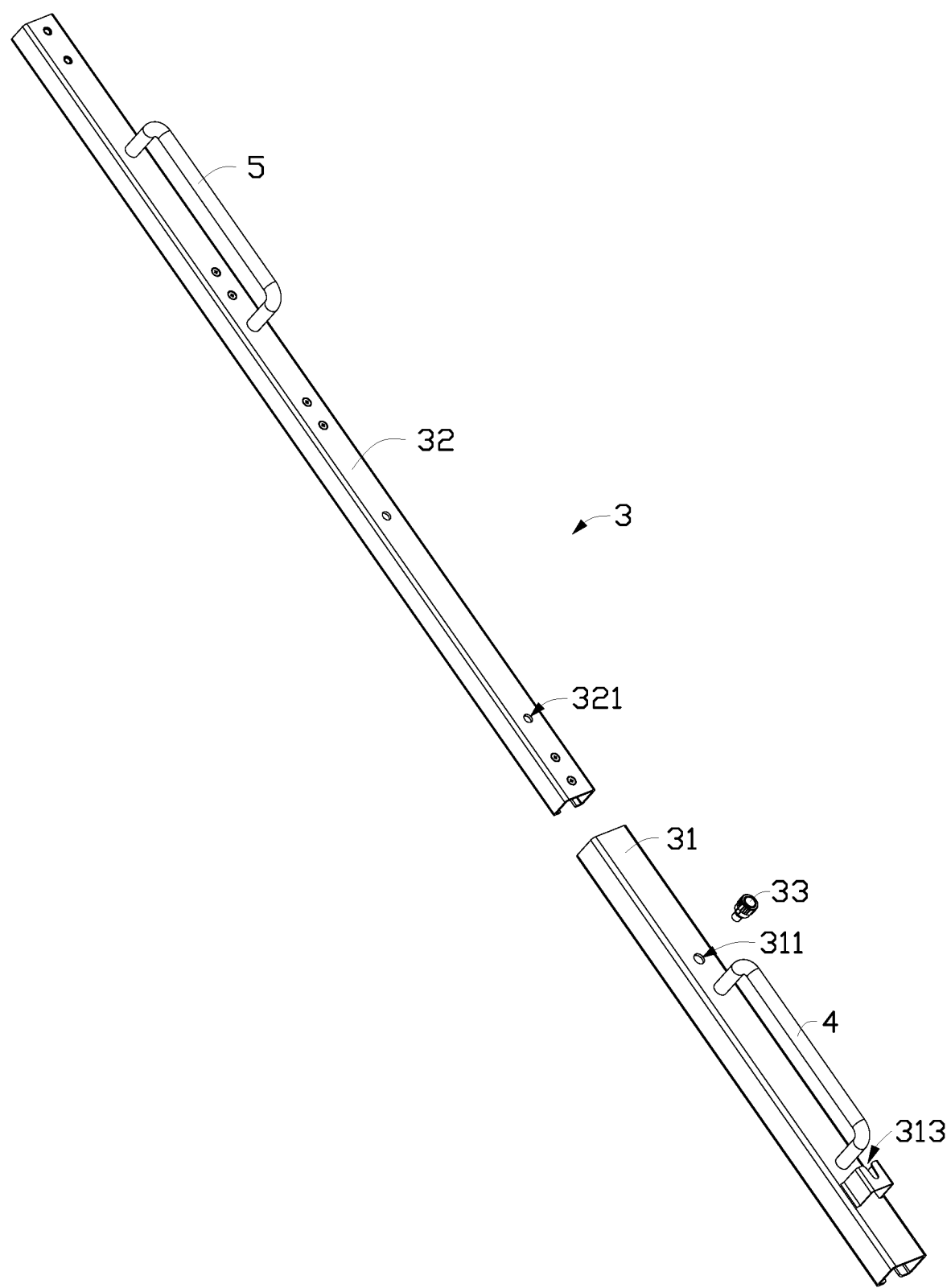
FIG. 2 is an isometric view of a component for supporting a lid of the tank according to an embodiment of the present disclosure.
Figure 3:
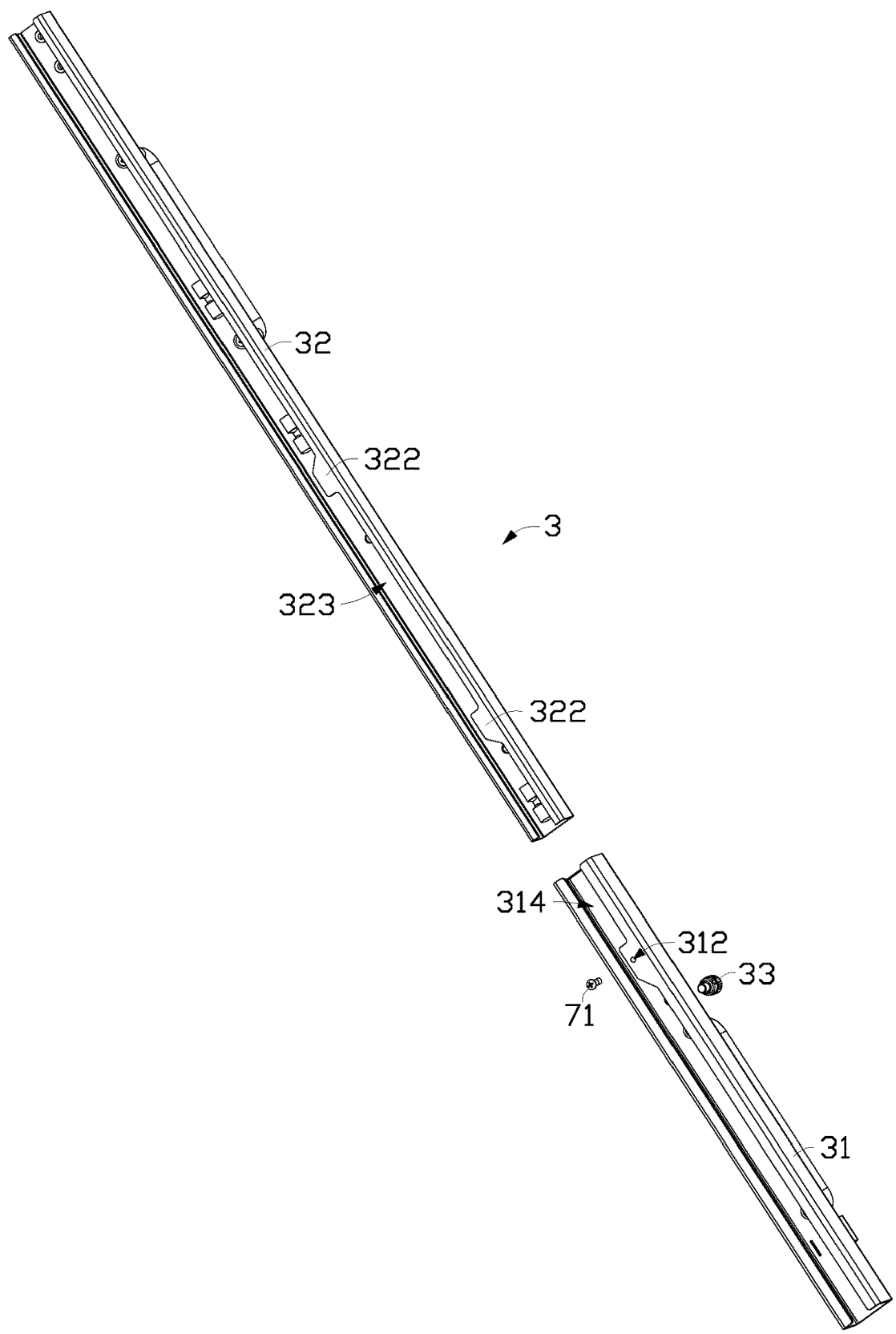
FIG. 3 is an isometric view of a supporting component according to an embodiment of the present disclosure.

In some embodiments, as shown in FIG. 2 and FIG. 3, each supporting component comprises a first rod 31, a second rod 32, and a pin 33. The first rod 31 is connected to the second rod 32 and is movable along the length of the second rod 32. The first rod 31 has a first hole 311. The second rod 32 has a plurality of second holes 321. Second holes 321 are arranged along the length of the second rod 32. One end of the second rod 32 is rotatably connected to the lid 2. The pin 33 can be inserted into the first hole 311 and a second hole 321 when aligned, so positioning the first rod 31 on the second rod 32. The end of the first rod 31 away from the second rod 32 is removably attached to the hold 72.

In opening the lid 2, first, the end of the first rod 31 is put into the hold 72, then the pin 33 is removed and the position of the second rod 32 relative to the first rod 31 is adjusted, to adjust the total length of the first rod 31 and the second rod 32, until the total length of the first rod 31 and the second rod 32 can support the lid 2 at the angle needed. A second hole 321 is then aligned to the first hole 311, and the pin 33 inserted into the aligned first hole 311 and second hole 321. In closing the lid 2, the first rod 31 is removed from the hold 72. After the lid 2 is closed, the one or more supporting components 3 are enclosed within the box 1 and hang from the lid 2.

In some embodiments, as shown in FIG. 2, the first rod 31 has a first handle 4, and the second rod 32 has a second handle 5, providing convenience in adjusting the first rod 31 and the second rod 32.

In some embodiments, as shown in FIG. 1, the lid 2 has at least one third handle 6, providing convenience in lifting or dropping the lid 2.

In some embodiments, as shown in FIG. 2 and FIG. 3, the first rod 31 has a first groove 314 along its length. The second rod 32 has a second groove 323 along its length. The second rod 32 is inserted into the first groove 314 and the first rod 31 is movable relative to the second rod 32 along its length. The first groove 314 is connected to the second groove 323 after the second rod 32 is inserted into the first groove 314. The first rod 31 has a third hole 312. A screw 71 is inserted into the third hole 312. The second rod 32 has two blocks 322 located on either side of the third hole 312 (screw 71) along its length. The block 322 is used to stop movement of the screw 71 to limit the moving distance of the first rod 31 relative to the second rod 32. The block 322 and the screw 71 also provide a permanent attachment between the first rod 31 and the second rod 32.

Figure 5:
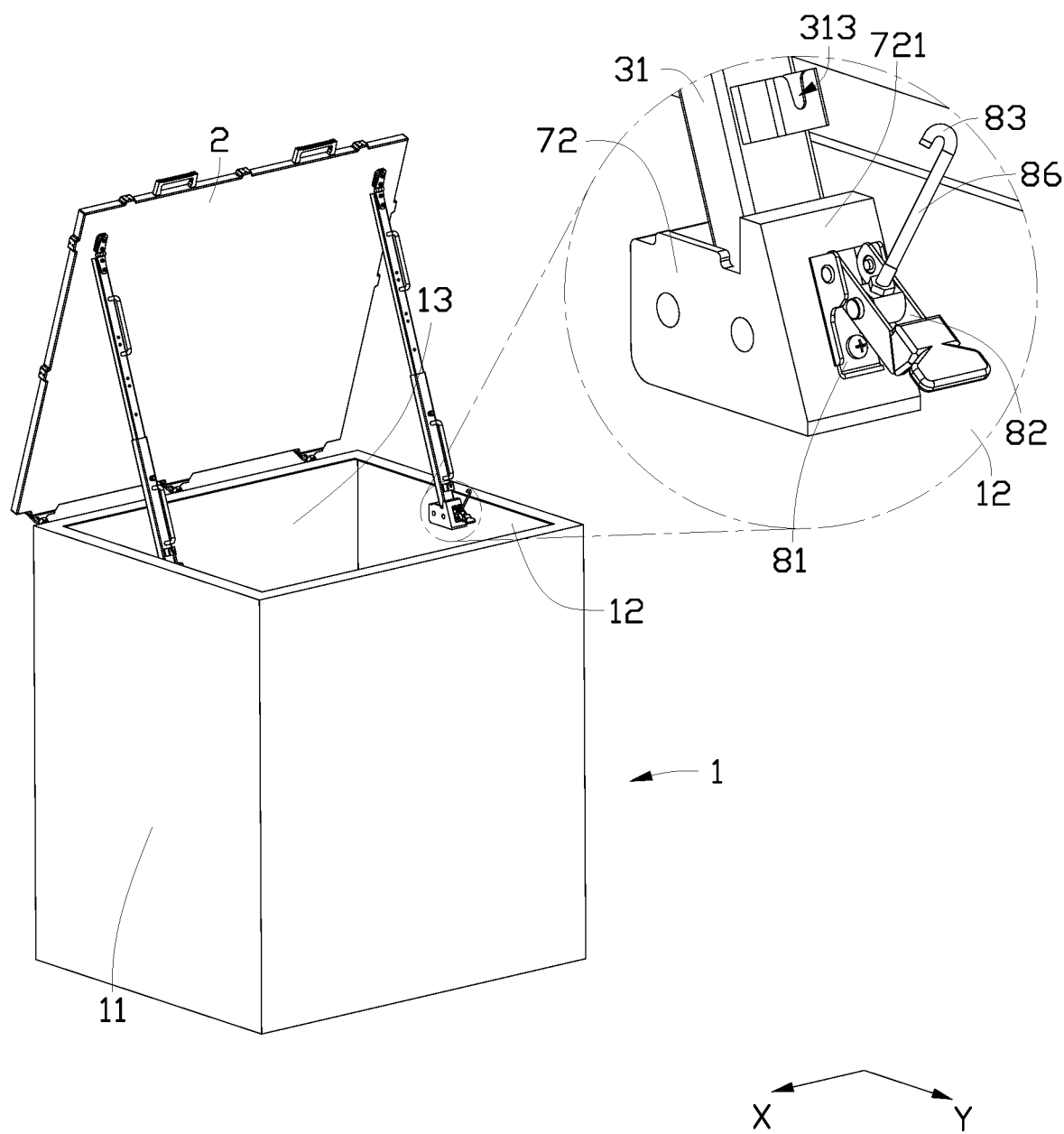
FIG. 5 is an isometric view of a tank according to an embodiment of the present disclosure.
Figure 6:
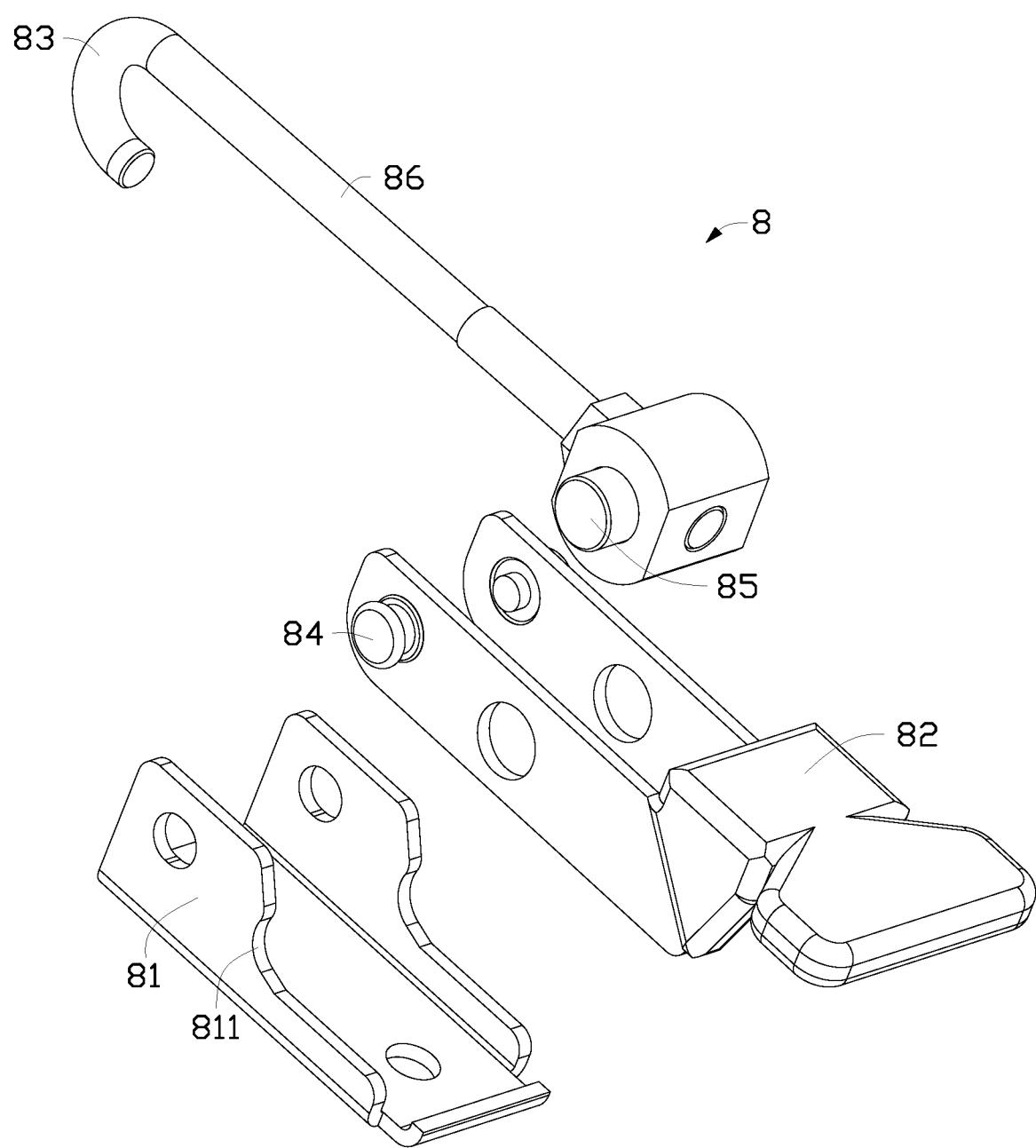
FIG. 6 is an exploded view of a buckle component acting on the supporting component according to an embodiment of the present disclosure.

In some embodiments, as shown in FIGS. 1, 5, and 6, the tank 100 further comprises a buckle component 8. The hold 72 has a beveled surface 721. The buckle component 8 is located on the beveled surface 721. The buckle component 8 secures the first rod 31 to the hold 72.

The buckle component 8 comprises a base 81, a lever 82, a hook 83, and an elastic pole 86. The base 81 is located on the bevel surface 721. The lever 82 is rotatably connected to the base 81 around a first axis 84. The elastic pole is connected between the second axis 85 and the hook 83. The elastic pole 86 exerts an elastic tension on the hook 83. The elastic pole 86 is rotatably connected to the lever 82 around a second axis 85. The base 81 has a positioning surface 811 to latch with the second axis 85. The first rod 31 has a positioning groove 313. The hook 83 is inserted into the positioning groove 313. When the lever 82 rotates down around the first axis 84, the lever 82 pulls down the elastic pole 86 and the hook 83, and the hook 83 pulls the first rod 31 down to the hold 72 until the second axis 85 is latched by the positioning surface 811, so fixing the first rod 31 to the hold 72. When the lever 82 rotates up around the first axis 84, the lever 82 lifts up the elastic pole 86 and the hook 83, and then the hook 83 leaves the first rod 31 and allowing the first rod 31 to be removed from the hold 72.

Figure 7:
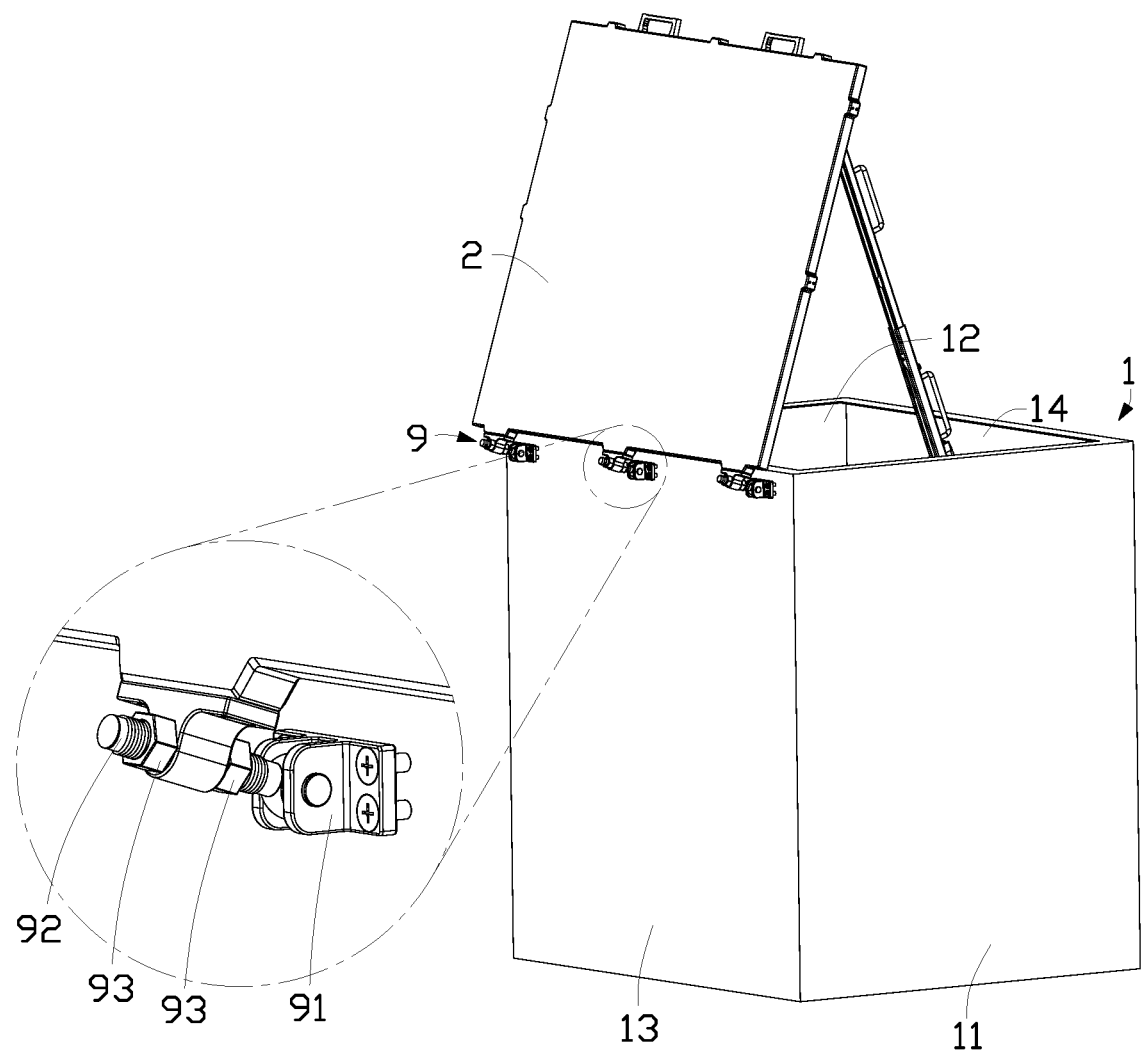
FIG. 7 is an isometric view of a tank according to an embodiment of the present disclosure.

In some embodiments, as shown in FIG. 7, the tank 100 further comprises a plurality of adjusting components 9. Each adjusting component 9 comprises a bracket 91, a lead screw 92, and two nuts 93. The bracket 91 is located on the outer surface of the third wall 13. One end of the lead screw 92 is rotatably connected to the bracket 91. The other end of the lead screw 92 goes through the lid 2. The two nuts 93 are connected to the lead screw 92 on either side of the lid 2 to fix the lid 2 to the lead screw 92. The adjusting components 9 can connect the lid 2 to the box 1, and can also adjust the relative positions of the lid 2 and the box 1, to slightly adjust the angle of the lid 2 when open under the condition of the same total length of the first rod 31 and the second rod 32.

Figure 4:
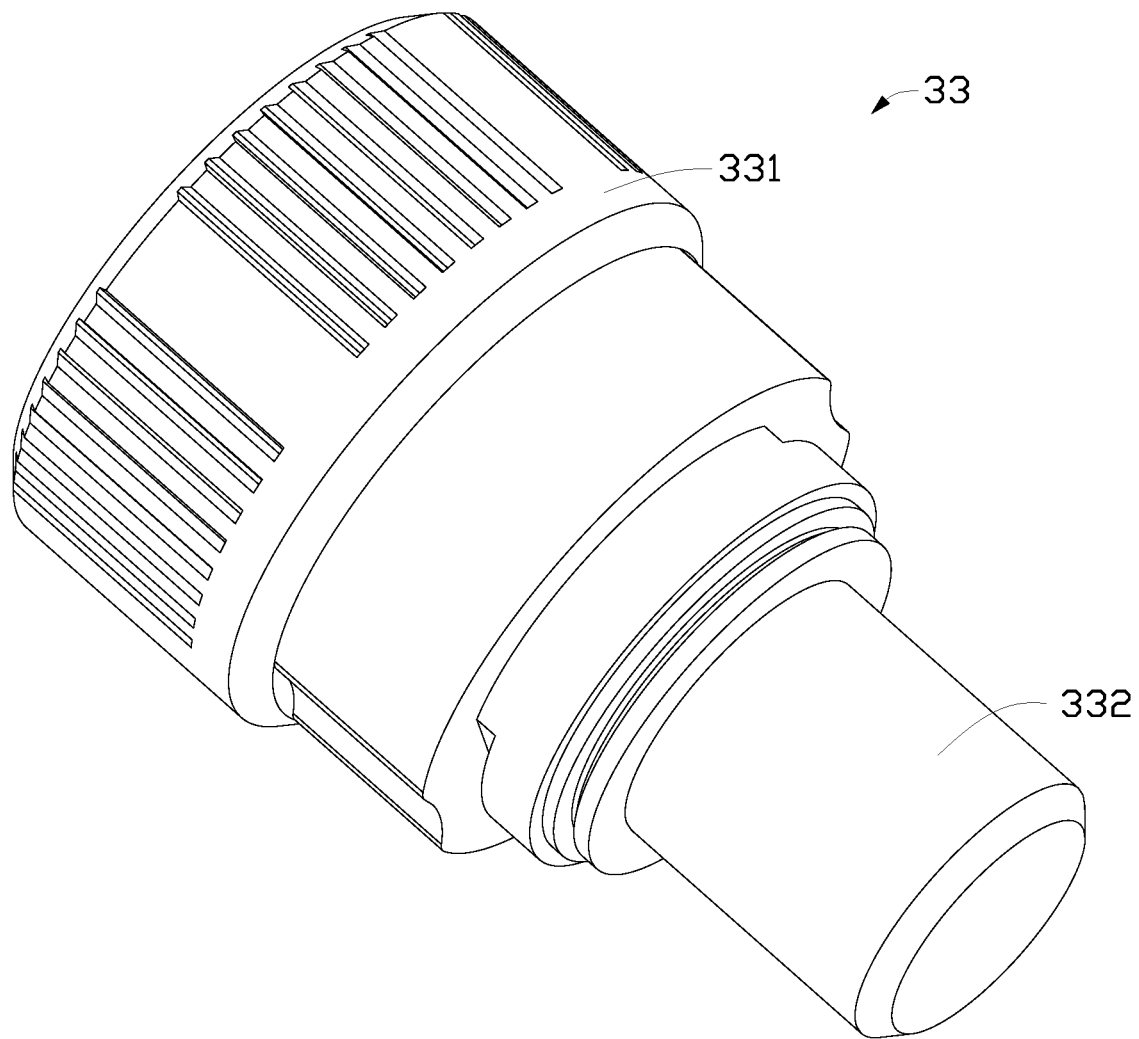
FIG. 4 is an isometric view of a pin of the supporting component according to an embodiment of the present disclosure.

In some embodiments, as shown in FIG. 4, the pin 33 comprises an inner column 332 and an outer column 331. The diameter of the inner column 332 is less than the diameter of the first hole 311 and the second hole 321. The inner column 331 is inserted into the aligned first and second holes 311 and 321. The diameter of the outer column 331 is greater than the diameter of the first hole 311 and the second hole 321. The operator can take out the pin 33 by pulling on the outer column 331.

In some embodiments, an immersion cooling system of an embodiment includes the tank 100 and a plurality of disks or other storage devices. The tank 100 is used for holding water. The storage devices are mounted in the tank 100 and immersed in the water to be kept cool.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. A tank comprising:
    a box defining an opening;
    a lid rotatably connected to the box, the lid being configured to cover or uncover the opening; and
    at least one supporting component, wherein each of the supporting component comprises a first rod, a second rod and a pin, the first rod is connected to the second rod and is movable along a length of the second rod, the first rod defines a first hole, the second rod defines a plurality of second holes along the length of the second rod, one end of the second rod is rotatably connected to the lid, the pin is insertable into the first hole and at least one of the plurality of second holes when the pin is aligned to position the first rod on the second rod, an end of the first rod away from the second rod is removably attached to the box;
    wherein: the first rod comprises a first groove along a length of the first rod, the second rod comprises a second groove along a length of the second rod, the second rod is movably inserted into the first groove along the length of the first groove, and the first groove is connected to the second groove, the first rod defines a third hole, the second rod comprises two blocks located on either side of the third hole along its length, a screw is inserted into the third hole, the block is configured to stop movements of the screw and the second rod.

2. The tank of claim 1, wherein:
    the box comprises a first wall, a second wall, a third wall, a fourth wall, and a bottom wall, the first wall, the second wall, the third wall, and the fourth wall are connected end to end, the first wall is parallel to the second wall, the third wall is parallel to the fourth wall, the first wall is perpendicular to the third wall, the bottom wall is connected to bottoms of each of the first wall, the second wall, the third wall, and the fourth wall, the opening is defined at tops of the first wall, the second wall, the third wall, and the fourth wall, the lid is hinged on any one of the first wall, the second wall, the third wall, and the fourth wall.

3. The tank of claim 1, wherein:
the lid is connected to the third wall, each of the first wall, the second wall, and the fourth wall comprises a hold, an end of the first rod away from the second rod is removably inserted into the hold, the hold is configured to support the first rod.

4. The tank of claim 3, wherein:
the tank comprises a buckle component, the buckle component is located on the hold, the buckle component is configured to secure the first rod to the hold.

5. The tank of claim 4, wherein:
the buckle component comprises a base, a lever and a hook, the base is located on the hold, the base has a first axis, the lever is connected to the first axis and is rotatable around the first axis, the lever has a second axis, the second axis is parallel to the first axis, the hook is connected to the second axis and is rotatable around the second axis, the second axis protrudes from the lever, the base comprises a positioning surface configured to latch with the second axis, the first rod comprises a positioning groove, the hook is inserted into the positioning groove, and wherein when the lever rotates around the first axis, the lever pulls the hook, the hook pulls the first rod to the hold until the second axis is latched by the positioning surface.

6. The tank of claim 5, wherein:
the buckle component further comprises an elastic pole, the elastic pole is connected between the second axis and the hook, the elastic pole is configured to exert an elastic tension on the hook.

7. The tank of claim 1, wherein:
the first rod comprises a first handle, the second rod comprises a second handle.

8. The tank of claim 1, wherein:
the tank further comprises a plurality of adjusting components, each of the adjusting components comprises a bracket, a lead screw and two nuts, the bracket is located on an outer surface of the box, one end of the lead screw is rotatably connected to the bracket, the other end of the lead screw extends through the lid, the two nuts are respectively connected to the lead screw on either side of the lid to fix the lid.

9. The tank of claim 1, wherein:
the pin comprises an inner column and an outer column, a diameter of the inner column is less than diameters of each of the first hole and the second hole, the inner column is insertable into the first and second holes when the first and the second holes are aligned, a diameter of the outer column is greater than diameters of each of the first hole and the second hole.

10. A tank comprising:
a box with an opening;
wherein the box has a first wall, a second wall, a third wall, a fourth wall, and a bottom wall, the first wall, the second wall, the third wall, and the fourth wall are connected end to end, the first wall is parallel to the second wall, the third wall is parallel to the fourth wall, the first wall is perpendicular to the third wall, the bottom wall is connected to the bottom of the first wall, the second wall, the third wall, and the fourth wall, the opening is formed at the tops of the first wall, the second wall, the third wall, and the fourth wall;
a lid rotatably connected to the third wall to open up or cover the opening; and two supporting component respectively located on the first wall and the second wall for balance in support; wherein each supporting component comprises a first rod, a second rod and a pin, the first rod is connected to the second rod and is movable along the length of the second rod, the first rod has a first hole, the second rod has a plurality of second holes along the length of the second rod, one end of the second rod is rotatably connected to the lid, the pin is inserted into the first hole and at least one of the plurality of second holes a second hele when aligned to position the first rod on the second rod, the end of the first rod away from the second rod is removably attached to the box;

wherein: the first rod comprises a first groove along a length of the first rod, the second rod comprises a second groove along a length of the second rod, the second rod is movably inserted into the first groove along the length of the first groove, and the first groove is connected to the second groove, the first rod defines a third hole, the second rod comprises two blocks located on either side of the third hole along its length, a screw is inserted into the third hole, the block is configured to stop movements of the screw and the second rod.

11. An immersion cooling system, comprising:
A tank for containing water; and
a plurality of storage devices mounted in the tank and immersed in the water; wherein
the tank comprises:
a box with an opening;
a lid rotatably connected to the box to open up or cover the opening; and
at least one supporting component, wherein
each supporting component comprises a first rod, a second rod and a pin, the first rod is connected to the second rod and is movable along the length of the second rod, the first rod has a first hole, the second rod has a plurality of second holes along the length of the second rod, one end of the second rod is rotatably connected to the lid, the pin is inserted into the first hole and a second hole when aligned to position the first rod on the second rod, the end of the first rod away from the second rod is removably attached to the box.

12. The immersion cooling system of claim 11, wherein:
the box has a first wall, a second wall, a third wall, a fourth wall, and a bottom wall, the first wall, the second wall, the third wall, and the fourth wall are connected end to end, the first wall is parallel to the second wall, the third wall is parallel to the fourth wall, the first wall is perpendicular to the third wall, the bottom wall is connected to the bottom of the first wall, the second wall, the third wall, and the fourth wall, the opening is formed on the top of the first wall, the second wall, the third wall, and the fourth wall, the lid is hinged on any one of the first wall, the second wall, the third wall, and the fourth wall.

13. The immersion cooling system of claim 11, wherein:
the lid is connected to the third wall, any of the first wall, the second wall and the fourth wall has a hold, the end of the first rod away from the second rod is removably inserted into the hold, the hold is configured to support the first rod.

14. The immersion cooling system of claim 13, wherein:
the tank comprises a buckle component, the buckle component is located on the hold, the buckle component is configured to secure the first rod to the hold.

15. The immersion cooling system of claim 14, wherein:
the buckle component comprises a base, a lever and a hook, the base is located on the hold, the base has a first axis, the lever is connected to the first axis and is rotatable around the first axis, the lever has a second axis, the second axis is parallel to the first axis, the hook is connected to the second axis and is rotatable around the second axis, the second axis protrudes from the lever, the base comprises a positioning surface configured to latch with the second axis, the first rod comprises a positioning groove, the hook is inserted into the positioning groove, and wherein when the lever rotates around the first axis, the lever pulls the hook, the hook pulls the first rod to the hold until the second axis is latched by the positioning surface.

16. The immersion cooling system of claim 15, wherein:
the buckle component further comprises an elastic pole, the elastic pole is connected between the second axis and the hook, the elastic pole is configured to exert an elastic tension on the hook.

17. The immersion cooling system of claim 11, wherein:
the tank further comprises a plurality of adjusting components, each adjusting component comprises a bracket, a lead screw and two nuts, the bracket is located on the outer surface of the box, one end of the lead screw is rotatably connected to the bracket, the other end of the lead screw goes through the lid, the two nuts are connected to the lead screw on either side of the lid to fix the lid.

18. The immersion cooling system of claim 11, wherein:
the pin comprises an inner column and an outer column, the diameter of the inner column is less than the diameter of the first hole and the second hole, the inner column is inserted into the aligned first and second holes, the diameter of the outer column is greater than the diameter of the first hole and the second hole.

* * * * *